United States Patent [19]

Ohata et al.

[11] Patent Number: 4,839,703
[45] Date of Patent: Jun. 13, 1989

[54] HIGH SPEED AND POWER TRANSISTOR

[75] Inventors: Keiichi Ohata; Hikaru Hida; Masaki Ogawa, all of Tokyo, Japan

[73] Assignee: NEC Corporation, Tokyo, Japan

[21] Appl. No.: 102,788

[22] Filed: Sep. 23, 1987

Related U.S. Application Data

[63] Continuation of Ser. No. 807,935, Dec. 12, 1985, abandoned.

[30] Foreign Application Priority Data

Dec. 12, 1984 [JP] Japan ................................ 262043

[51] Int. Cl.⁴ .............................................. H01L 29/78
[52] U.S. Cl. ...................................... 357/22; 357/15; 357/16; 357/55; 357/58; 357/61
[58] Field of Search ................ 357/15, 16, 22 A, 22 C, 357/22 I, 55, 58, 61

[56] References Cited

U.S. PATENT DOCUMENTS

| 4,075,652 | 2/1978 | Umebachi et al. | 357/22 |
| 4,486,766 | 12/1984 | Shannon | 357/22 |
| 4,558,337 | 12/1985 | Saunier et al. | 357/22 |

Primary Examiner—Edward J. Wojciechowicz
Attorney, Agent, or Firm—Sughrue, Mion, Zinn, Macpeak & Seas

[57] ABSTRACT

A high speed and high power transistor includes a first layer of a first semiconductor material, a second layer of a second semiconductor material formed on the first layer, the second semiconductor material having a smaller electron affinity than the first semiconductor material, first and second electrode positioned ends of the second layer, respectively, in contact with the first layer, and a control electrode formed on the second layer between the first and second electrodes, the control electrode injecting holes into the second layer in accordance with an input signal to induce an electron channel between the first and second electrodes.

2 Claims, 3 Drawing Sheets

HIGH SPEED AND POWER TRANSISTOR

This is a continuation of application Ser. No. 807,935, filed 12-12-85, now abandoned.

BACKGROUND OF THE INVENTION

1. Field of the Invention

The present invention relates to a structure of a transistor operable at a high frequency with high power.

2. Description of the Prior Art

In recent years, high speed IC's operable at a higher frequency than Si-IC's have been widely studied, which employ FET's using compound semiconductors such as GaAs-schottky gate FET's and AlGaAs/GaAs modulation doped FET. Such FET's, however, have poor capability of driving a large current and therefore do not exhibit the expected high operation speed in a case where they are combined in LSI.

Another attempt at a high speed IC has been carried out with use of hetero-bipolar transistors (HBT's) using, as a base region, a semiconductor having larger band gap than a semiconductor used for an emitter region. A typical example is an HBT using GaAs for the base region and AlGaAs for the emitter region, as reported in 1981 International Electron Devices Meeting Digest, pp. 629 to 632. These HBT's still involve a lot of problems. For examples, they have a complex structure and complicated manufacturing process, which make it difficult to use them in a high integration IC. Moreover, the capacitance between collector and base regions is too large to limit the high operability of the HBT's.

SUMMARY OF THE INVENTION

The primary object of the present invention is to provide a transistor operable at a high frequency with high power which is suitable for use in a highly integrated, high speed IC.

According to the present invention, a transistor comprises a first semiconductor layer having a small impurity density, a second semiconductor layer formed on the first semiconductor layer and made of a pure or N-type semiconductor material which has a higher electron density than the first semiconductor layer, first and second electrodes ohmically contacting with respective ends of the second semiconductor layer, a third layer formed on the second semiconductor layer at a portion between the first and second electrodes to form a rectifying junction with the second semiconductor layer, and means for applying an input signal to the third layer, the third layer; injecting holes into the second semiconductor layer in response to the input signal which forward-biases the rectifying junction, and the injected holes forming an electron channel at the surface of the first semiconductor layer facing to the second semiconductor layer.

The transistor according to the present invention uses the electron channel produced at the boundary between the first and second semiconductor layers and functioning similarly to the two-dimensional electron channel. Since the two-dimensional electron channel is produced in a low impurity semiconductor of the first semiconductor layer, it has a characteristic of operating at a high frequency. Therefore, the transistor according to the present invention is operable at a high frequency.

The conductivity of the channel formed by the electron channel is modulated by the injection of holes, similar to a bipolar transistor. This mechanism allows the transistor according to the invention to operate with a high power.

The structure of the transistor according to the present invention is simple and easy to manufacture. This makes it possible to form a high speed and high power IC with use of the transistor of the present invention.

BRIEF DESCRIPTION OF THE DRAWINGS

The above-mentioned and other objects, merits and features will become apparent from the following description taken in conjunction with the drawings, wherein.

DETAILED DESCRIPTION OF THE PREFERRED EMBODIMENTS

Figure 1:
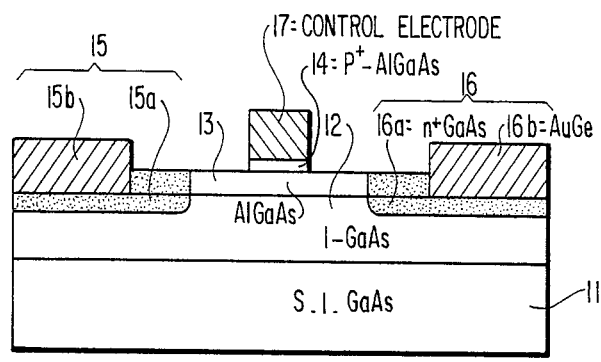
FIG. 1 is a sectional view showing a principal structure of the transistor according to the present invention.

The principal structure of the transistor according to the present invention is shown in FIG. 1 and includes a semi-insulating GaAs substrate 11, a small impurity or undoped GaAs layer 12 and an undoped AlGaAs layer 13. Since the electron affinity of AlGaAs is lower than GaAs, a channel of electrons is induced at the surface of the GaAs layer 12 adjacent to the AlGaAs layer 13. The conductivity of the electron channel is controlled by a potential applied to a control electrode 17 of AuZn alloy, for example, which is coupled to the AlGaAs layer 13 through a P+-AlGaAs layer 14. At the respective ends of the AlGaAs layer 13, a pair of electrodes 15 and 16 are disposed with a structure of n+-GaAs regions 15a and 16a and AuGe alloys 15b and 16b.

Figure 2:
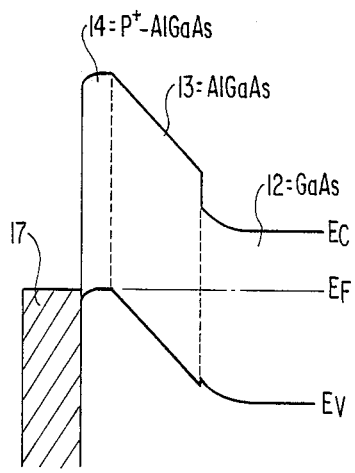
FIGS. 2 and 3 are diagrams of energy band structure showing the principle of the present invention.
Figure 3:
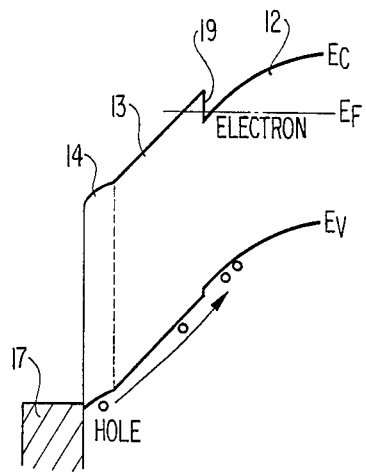

At the thermal equilibrium, the energy band diagram under the control electrode 17 is as shown in FIG. 2 wherein $E_C$, $E_F$ and $E_V$ respectively show the lower end of the conduction band, Fermi-level and the upper end of valence band. In a case where the electrode 15 is grounded and a sufficiently high positive voltage is applied to the control electrode 17, the hole (shown by the symbol o) injection from the control electrode 17 is generated in accordance with a voltage which forward-biases the rectifying junction between the AlGaAs layer 13 and the p+-AlGaAs layer 14, as shown by arrows in FIG. 3.

In accordance with the hole injection, electrons are induced to neutralize the charge of holes. Thus induced electrons are accumulated in an energy pocket 19 in the GaAs layer 12 at the boundary between the GaAs layer 12 and the AlGaAs layer 13 to form a channel of electrons similar to the two-dimensional electrons. Those induced electrons increase in accordance with increase of the injected holes. With increase of the induced electrons, they achieve a plasma state to exhibit very high conductivity.

Figure 4:
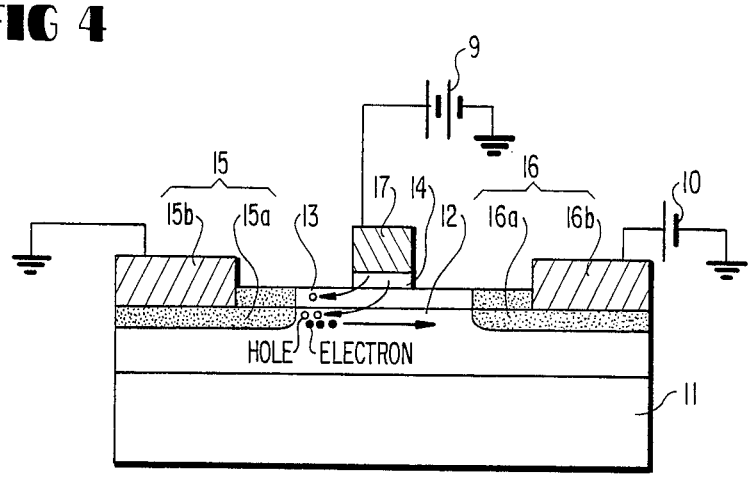
FIG. 4 is a sectional view showing an operation of the transistor according to the present invention.

FIG. 4 shows the above-mentioned mechanism in a case where the electrode 15 is grounded, the electrode 16 is powered with a power source 10 and the control electrode 17 has a positive control voltage applied to it from a voltage source 9 to forward-bias the rectifying junction between the AlGaAs layer 13 and the p+-AlGaAs layer 14. Holes are injected from the control electrode 17 toward the electrode 15. In accordance with the injected holes, electrons are induced at the surface of GaAs layer 12. The induced electrons are accelerated by the electric field between the electrodes 15 and 16 to cause a large current flow therebetween. In other words, the induced electrons are similar to the two-dimensional electrons produced at the boundary between semiconductor layers of different electron affinities. Therefore, a high speed operation is achieved. The modulation of current between two electrodes 15 and 16 is conduction modulation by hole injection, similar to a bipolar transistor. The conduction modulation allows a high current to flow to make high power operation possible. The structure is very simple, similar to that of field effect transistor. Therefore, the transistor of the present invention is easy to manufacture and is suitable for being formed in an integrated circuit. This means that a high speed and high power IC can be formed with use of the transistor of the present invention.

Here, it is noted that, while the AlGaAs layer 13 may be doped with N-type impurity, it is required in such case to be formed very thin and to be formed with such low impurity concentration that electrons may be ignored as compared with injected holes. Similarly, the electrons in the GaAs layer 12 all so few that they are ignored compared with the injected holes.

Figure 5:
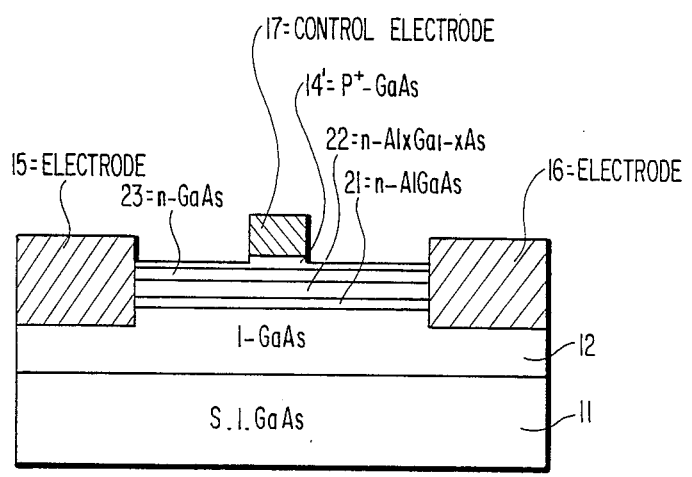
FIG. 5 is a sectional view showing a preferable embodiment of the present invention.

A preferred embodiment of the present invention will next be described with reference to FIG. 5. On a semi-insulating GaAs substrate 11, an undoped GaAs layer 12 is formed. An N-type $Al_{0.3}Ga_{0.7}As$ layer 21, an N-type $Al_xGa_{1-x}As$ layer 22 where x changes continuously from 0.3 to 0, and an N-type GaAs layer 23 are consecutively formed on the GaAs layer 12 as the single AlGaAs layer 13 in FIG. 1. Between the GaAs layer 23 and the control electrode 17, p+-type GaAs Layer 14' is interposed in place of the p+-type AlGaAs layer 14 in FIG. 1. Electrodes 15 and 16 disposed at the respective ends of the layers 14', 23, 22 and 21 is respectively composed of an N+-region formed to reach the GaAs layer 12 and an evaporated Au-Ge-Ni alloy. These electrodes 15 and 16 may alternatively formed by alloying the layers 14', 23, 22, 21 and 12 with the Au-Ge-Ni alloy. The control electrode is made of Al. Here, the uppermost layer 14 is GaAs. This are because the electrodes 15 and 16 is easily formed by alloying with the Au-Ge-Ni alloy and are suitable for surface passivation. This ease of the formation of the electrodes 15 and 16 becomes even more so by use of N-type material in the layers 21, 22 and 23. The p+-GaAs layer 14' outside the portion under the control electrode 17 is required to be formed so thin that the p+-GaAs layer 14' may be depleted by depletion layer from the PN-junction between the layers 23 and 14'.

The carrier densities and the thickness of the respective layers may be selected as follows, for example. The undoped GaAs layer 12 has a carrier density of $1 \times 10^{14}$ cm$^{-3}$ pf P--type and a thickness of 1 $\mu$m. The N-type AlGaAs layer 21, the N--type $Al_xGa_{1-x}As$ and the N-type GaAs layer 23 are respectively 100 Å, 150 Å and are 50 Å and doped with Si with a concentration of $2 \times 10^{18}$ cm$^{-3}$. The P+-type GaAs layer 14' is doped with Be with a concentration of $3 \times 10^{19}$ cm$^{-3}$ and has a thickness of 100 Å under the control electrode 17 and a thickness of 15Å at the other portion.

Figure 6:
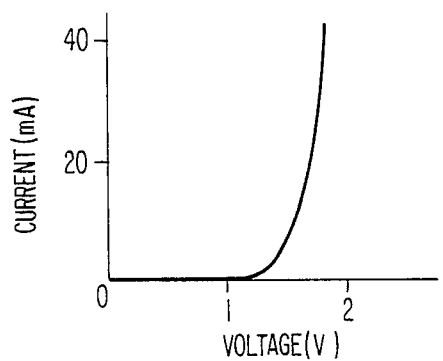
FIGS. 6 to 8 are diagrams showing characteristics of the transistor according to the present invention.

FIG. 6 shows a relationship of current and voltage between the electrode 15 and the control electrode 17, when the control electrode 17 is designed to have a length of 0.5 $\mu$m and a width of 200 $\mu$m. It becomes apparent from FIG. 6 that, if the current is made large, dynamic resistance becomes small to increase the conductivity abruptly.

Figure 7:
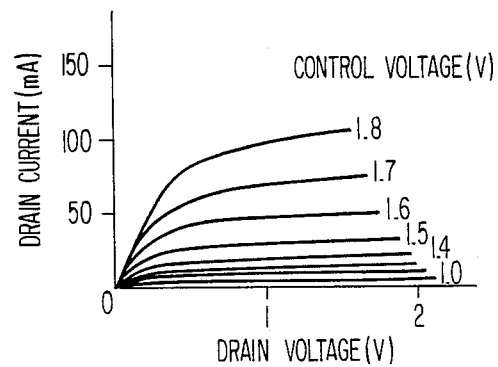
Figure 8:
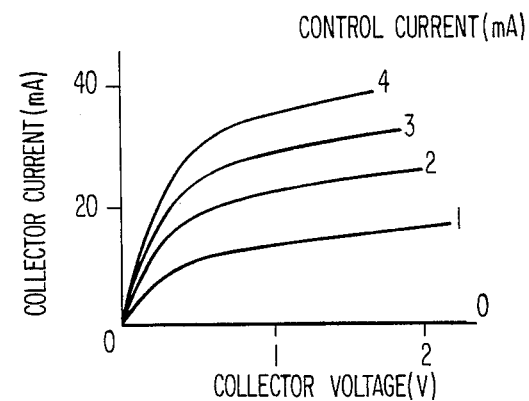

FIGS. 7 and 8 show relationships of output voltage and current. FIG. 7 shows an FET mode of operation in which the voltage at the control electrode 17 is held constant. The mutual conductance is as high as 1,500 ms/mm. The saturation voltage is low and source resistance is small. FIG. 8 shows an bipolar mode of operation in which the current flowing into the control electrode 17 is held constant. The current gain is 20 in the range of small collector current and 8 in the range of large collector current.

One example of manufacturing the preferred embodiment will now be explained. The undoped GaAs layer 12, the N-type AlGaAs layer 21, the N-type $Al_xGa_{1-x}As$ layer 22, the N-type GaAs layer 23 and the P+-type GaAs layer 14' are consecutively formed on the semi-insulating GaAs substrate 11 by molecular beam epitaxy (MBE) method. Al layer is then evapolated on the P+-type GaAs layer 14. An etching mask is covered on the Al layer except for the portion corresponding to the electrodes 15 and 16 and then selective etching is processed to the Al layer to expose the p+-type GaAs layer 14'. Further, the Al layer is side-etched by use of the same etching mask to form the control electrode 17. While the etching mask is maintained, Au-Ge-Ni alloy is evaporated and is selectively removed by a lift-off method using a removal of the etching mask. The remaining Au-Ge-Ni alloy is alloyed with the layers 14', 23, 22, 21 and 12 by a heat treatment to form the electrodes 15 and 16. Finally, the exposed P+-type GaAs layer 14' is subjected to a surface etching until a leakage current between the electrodes 15 and 16 becomes zero.

As explained in detail, the present invention provides a transistor operable at high speed and with high power, and is suitable for combining in a high speed and high power IC.

What is claimed is:
1. A transistor comprising:
   a semi-insulating substrate;
   a first layer of undoped GaAs formed on said semi-insulating substrate;
   a second layer of undoped AlGaAs formed on said first layer, said second layer having a smaller electron affinity than said first layer;
   first and second doped regions formed at both ends of said first and second layers in contact with said first and second layers;
   a third layer of P-type AlGaAs formed on said second layer between said first and second doped regions;
   first and second metal electrodes respectively connected to said first and second doped regions; and
   a third metal electrode connected to said third layer, no electron channel being present between said first and second layers when said first to third metal electrodes have no potential applied thereto, an electron channel being induced when holes are injected into said second layer from said third layer when potential is applied to said first to third metal electrodes.

2. A transistor comprising:
   a semi-insulating substrate;
   a first layer of undoped GaAs formed on said semi-insulating substrate;

a second layer of N-type $Al_xGa_{1-x}As$ formed on said first layer, said $Al_xGa_{1-x}As$ continuously changing the value x from a predetermined value to zero as separating from said first layer;

first and second metal electrode electrically connected to both ends of said first and second layers, respectively;

a third layer of P-type GaAs formed on said second layer between said first and second metal electrodes to form a PN junction with said second layer; and a third metal electrode coupled to said third layer for receiving an electrical signal to forward bias said PN junction, a thickness and N-type impurity concentration of said second layer being such that no electron channel between said first and second layers is present when no potential is applied to said first to third electrodes, said third layer injecting holes into said second layer in accordance with the forward-biasing voltage, the injected holes inducing an electron channel between said first and second electrodes in the surface region of said first layer, such that a current flows between said first and second metal electrodes through said electron channel.

* * * * *